United States Patent [19]

Pravda et al.

[11] 4,012,770
[45] Mar. 15, 1977

[54] COOLING A HEAT-PRODUCING ELECTRICAL OR ELECTRONIC COMPONENT

[75] Inventors: Milton F. Pravda; Walter B. Bienert, both of Baltimore, Md.

[73] Assignee: Dynatherm Corporation, Cockeysville, Md.

[22] Filed: Sept. 28, 1972

[21] Appl. No.: 293,005

[52] U.S. Cl. .......................... 357/82; 165/DIG. 3; 165/105; 165/185
[51] Int. Cl.² .................. H01L 23/42; F28D 15/00
[58] Field of Search ............... 165/105, 80, 185; 317/100, 234 A, 234 B; 174/15 R; 357/82

[56] References Cited

UNITED STATES PATENTS

| 3,248,615 | 4/1966 | Weisshaar et al. | 317/234 A X |
| 3,261,396 | 7/1966 | Trunk | 165/80 X |
| 3,275,921 | 9/1966 | Fellendorf et al. | 317/234 B X |
| 3,543,841 | 12/1970 | Eastman | 165/105 X |
| 3,658,125 | 4/1972 | Freggens | 165/105 X |
| 3,673,306 | 6/1972 | Kirkpatrick | 165/105 X |
| 3,715,632 | 2/1973 | Warburton | 317/234 A X |
| 3,739,234 | 6/1973 | Bylund et al. | 165/105 X |

FOREIGN PATENTS OR APPLICATIONS 804,297  11/1958  United Kingdom ............... 165/105

Primary Examiner—Albert W. Davis, Jr.
Attorney, Agent, or Firm—A. H. Caser

[57] ABSTRACT

Vapor chamber-containing apparatus is provided for cooling heat-producing electrical and electronic components wherein the heat is absorbed by a vaporizable agent.

12 Claims, 10 Drawing Figures

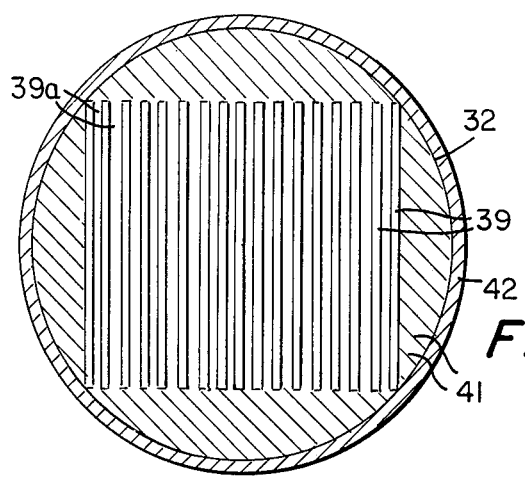
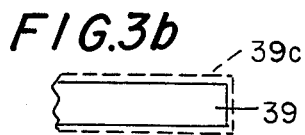
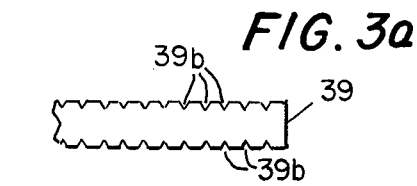
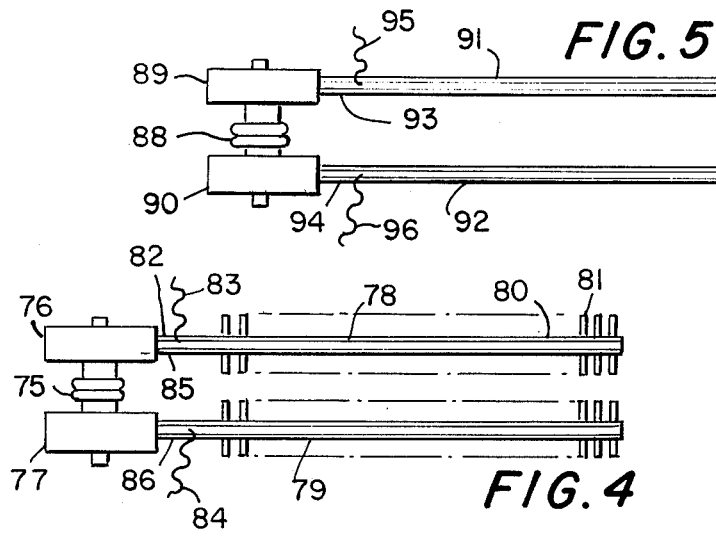
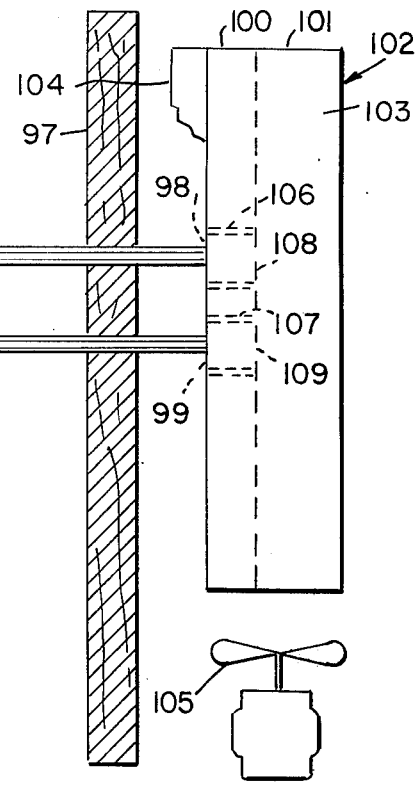
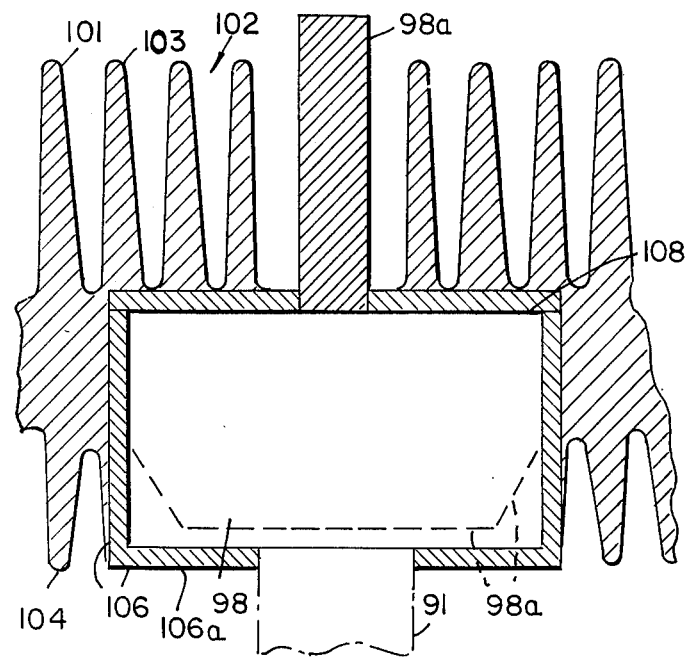

COOLING A HEAT-PRODUCING ELECTRICAL OR ELECTRONIC COMPONENT

CROSS-REFERENCE TO RELATED APPLICATION

A portion of the disclosure herein, comprising a copper plug-containing heat sink, an electrically non-conducting liner for the plug, and a liquefied metal interface for the plug are disclosed and claimed in copending application Ser. No. 289,731, filed Sept. 15, 1972, now U.S. Pat. No. 3,766,977, issued on Oct. 23, 1973.

BACKGROUND OF THE INVENTION

1. The Field of the Invention comprises devices and equipment for cooling heat-producing electrical and electronic components, including apparatus that incorporates heat sinks and heat pipes.

2. Heretofore, a heat-producing component, such as a power semiconductor, has been cooled by compressively engaging it between two low cost aluminum units of a heat sink, each unit comprising a web or wall having fins extending therefrom. With semiconductors being made of greater and greater power, and thus capable of emitting more and more heat, these conventional heat sinks have been found to be less than adequate, permitting the semiconductors to reach such high temperatures as to result in a decreased service life. Copper heat sinks are better but are much more expensive, and in many instances their use cannot be justified. According to the patent application identified above, aluminum heat sinks are proposed which incorporate at a critical location a small quantity of copper in the form of a copper plug, thus combining the low cost advantage of aluminum and the high performance of copper.

In the present invention, a vapor chamber, having substantially the outward appearance of said copper plug, is used to absorb heat from the component and thus cool the same. The absorbed heat vaporizes a working agent in the chamber, and the vaporized agent is then condensed, either inside or outside the chamber, to liberate heat of condensation, which is dissipated. An advantage is that the vaporized agent may be condensed at a distance from the chamber, thus allowing the component to be separated from the point at which the heat is dissipated; and from a practical standpoint this means that the component can be cooled even while it is enclosed within a cabinet. But if desired, and as noted, the vaporized agent can also be condensed inside the chamber.

SUMMARY OF THE INVENTION

The apparatus for cooling a heatproducing component includes a vapor chamber for receiving heat from the component, vapor cooling means for abstracting heat from the vapors and acting to condense them, thereby producing heat of condensation, and means for dissipating the liberated heat of condensation. In one form of the invention, the vapor chamber is associated with a conventional aluminum heat sink which acts to cool the vapors and, via the fins thereof, to dissipate the liberated heat; and in another form, the vapor chamber is associated with one or more finned heat pipes which act to cool the vapors and, via the fins thereof, to dissipate the liberated heat. In still another form, the vapor chamber is used with both heat sink and heat pipes.

BRIEF DESCRIPTION OF THE DRAWINGS

The invention is illustrated in the accompanying drawings, which are diagrammatic, and in which

FIG. 3 is a cross-sectional view along line 3—3 of FIG. 1 showing only the vapor chamber;

FIG. 3a is a partial enlarged side view of one modification of a fin of FIG. 3;

FIG. 3b is a view like FIG. 3a showing another modification;

FIG. 4 is a view of a heat-producing electronic component positioned between a pair of vapor chambers each of which has a finned heat pipe extending therefrom;

FIG. 5 is a view like FIG. 4 but showing the component and the vapor chambers disposed inside a cabinet and showing the heat pipes extending beyond the cabinet wall and terminating in heat-dissipating means, the latter including a heat sink;

FIG. 6 is a partial cross-sectional view of a modification of the heat sink structure of FIG. 5 with the interior construction of the vapor chamber omitted;

DESCRIPTION OF THE SPECIFIC EMBODIMENTS

Figure 1:
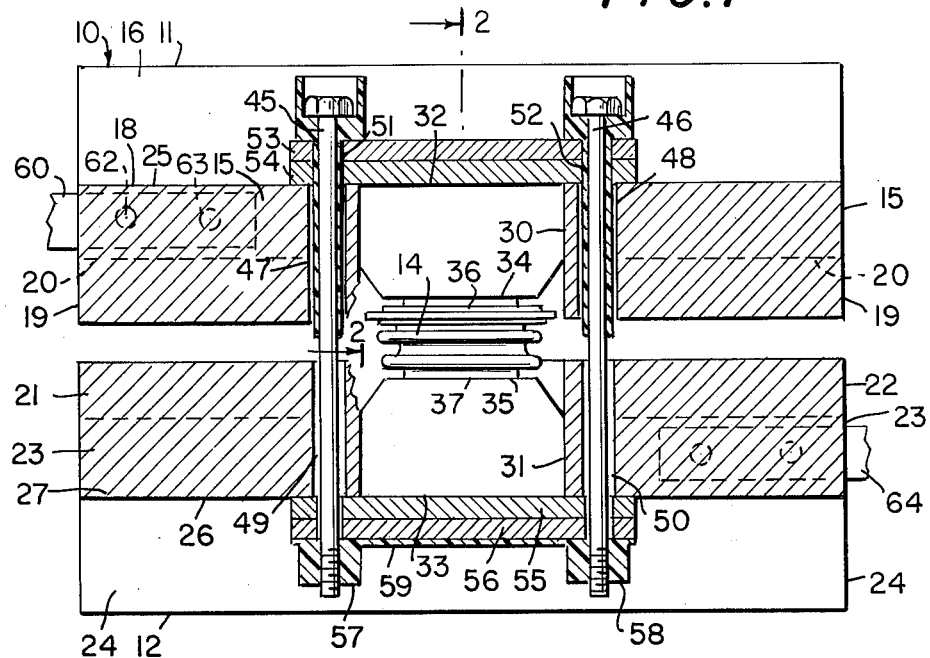
FIG. 1 is a longitudinal cross-sectional view through a two-unit heat sink of the invention showing a heat-producing component positioned between two vapor chambers that are incorporated in the heat sink units; the section is along the line 1—1 of FIG. 2.

Referring to FIG. 1, the heat sink 10 comprises two heat sink units 11, 12, and a semiconductor 14. As will be described, heat sink 10 is an example of a "power package", and a semiconductor or SCR, as used therein, is a reverse blocking triode thyristor, i.e., a three-terminal solid state electrical switching device that allows large current flow in the forward or rectifying direction when a small signal is applied to a control or gate terminal of the device and that blocks current flow in the reverse direction. Very large currents may flow through SCRs (silicon controlled rectifiers), going up to 1000, 2000, or more amperes, and as may be realized, such currents produce heat (generated by $I^2R$ and other losses) which must be dissipated. The problem is complicated by the fact that the heat must be removed from the SCR end faces, each usually of a diameter of less than two inches.

The SCR or thyristor in heat sink 10 is held so that its flat end faces are engaged by a flat planar surface of a heat sink unit. Each unit is an aluminum extrusion comprising a web or wall having fins extending therefrom. Unit 11 thus comprises the web or wall 15 having two groups of fins 16, 17 extending from side 18 and a group of fins 19 extending from side 20; and unit 12 has fins 21, 22 on the upper side of web 23 and fins 24 on the lower side. The fins 19 extend from the entire lower side 20 with the exception of an area occupied by chamber 32, to be described. Means are provided on each unit for compressing together a pair of units having an SCR therebetween; on unit 11 such means comprise on side 18 a planar unfinned strip 25; and on unit 12 they comprise a similar strip 26 on side 27 of web 23. These strips permit clamping or bolting together of units 11 and 12 having the SCR 14 therebetween.

Actually, units 11 and 12 are the same. They are simply lengths cut off from extruded stock. As may be seen from FIGS. 1 and 2, unit 11 has a recess 30, preferably a circular one although it may have any other suitable outline shape, in the web or wall 15 which opens through the lower side 20. Unit 12 has a similar recess 31 opening through the upper side of web 23. In each recess a vapor chamber is disposed, note chambers 32, 33 in FIGS. 1 and 2, each of which has the same outline shape as the recess. Each chamber has a sufficiently tight fit in its recess as to permit effective heat transfer and current flow between the chamber and the web of the heat sink units; preferably the chamber is shrink fitted into the recess, comprising taking a chamber of slightly larger diameter than the recess, heating the heat sink unit to 300° to 600° F. to expand the same, including expanding the recess, cooling the chamber to −100° to plus 32° F. to contract it, and immediately placing the cooled chamber in the expanded recess. When the chamber and unit return to room temperature, the chamber will have a shrink fit in the recess, i.e., the walls of the recess will have contracted about the chamber. The difference between the larger diameter of the chamber over the smaller diameter of the recess, at ambient conditions, is termed the "interference", and for purposes of the invention it is desirable that the interference shall be at least 0.001 or 0.002 inch and range up to 0.004, 0.006, 0.008 inch or higher; it increases with increasing diameter of the chamber, say 0.002 inch for each inch of chamber diameter.

Each chamber has an exposed surface, note surfaces 34, 35, in FIG. 1, which respectively engages the end faces 36, 37 of the SCR 14. These face or surface engagements are effective for the passage of current therethrough and also for the transfer of heat from the SCR to the chambers. Considering chamber 32 of FIG. 2, the heat flow across the end face 34 acts to vaporize a vaporizable agent indicated at 38 which is present in the chamber in an amount sufficient to saturate the wick 39a covering the surfaces of the fins 39, the latter extending upwardly from the entire inner surface of face 34. Suitably, the fins extend for about ⅛ of the distance between face 34 and the opposite wall 40, although the amount of such extension is variable. The wick or capillary material 39a may be in the form of V-shaped grooves 39b, note FIG. 3a, on opposite sides of fins 39, or in the form of a wicking material 39c, note FIG. 3b, preferably in contact with the fins 39. The material 39c may be any suitable kind, such as fine mesh screen like 200 mesh copper screen, felt material, metal foams, silica fabrics, etc. The wick material 39c should be compatible with the working agent and with the material of which the chamber is made. If grooves 39b constitute the wick or capillary, they may suitably be 1/64 inch wide by 1/64 inch deep and spaced 1/32 inch apart; however, other dimensions are useful, ranging from 1/128 to 1/16 inch for width and depth and spacing. The purpose of the grooves or wicking material is to enable the fins to have a wicking action, as described below. The volume of chamber 32 not covered by fins 39 is at least largely occupied by a second wick material, preferably separate from the first, indicated by the wavy lines 41, which may be like the wick material 39c.

As heat is absorbed by the agent 38, it is vaporized, and the vapors flow to all parts of the chamber, including the colder walls 40 and 42 where they condense, giving up heat which passes across such walls by conduction to the aluminum web 15 of unit 11, then to the fins 16, 17, and 19, and it is dissipated by the latter to atmosphere. The condensed vapors are pumped by capillary action of the wick 39a and wick 41 to the base of the fins, and thence up the fins by capillary action of the wick 39a.

It will be noted (FIGS. 1 and 2) that the chamber 32 extends for only part of its length into the recess 30. Also, the chamber is tapered over a short distance 43 before it terminates in the end face 36. The purpose of the taper is to conserve material and weight without materially affecting performance. The opposite chamber 33 and recess 31 are similar in construction to the foregoing and therefore need not be described. If desired, the taper may be eliminated and the chamber sides made straight.

Both chambers, it may be noted, have a depth that is relatively shallow, being of approximately the order of magnitude as the depth of the semiconductor or other component. The diameter of each chamber is greater than its depth.

It may be mentioned that a shrink fit, as described, provides very effective thermal and electrical contact between the chamber and the heat sink web. It is significant that during thermal cycling of the heat sink, the chamber is in a state of compression. Thermal cycling occurs during conditions when electrical equipment connected to the heat sink is alternately turned on and off. When the equipment is turned on, the heat sink will get hot and dissipate heat, and when the equipment is turned off, the fans blowing air over the fins will cool the heat sink. The chamber is in a state of compression by virtue of the interference factor, described above, which is effective even at elevated temperatures. For example, consider an interference factor at room temperature (68° F.) of 0.002 inch (0.002 inch per inch diameter of the vapor chamber). If the heat sink is heated to 168° F., the aluminum heat sink will expand more than the chamber, which is preferably made of copper, and the chamber will loosen by about 0.0004 inch (0.0004 inch per inch diameter); but this is less than the interference factor, and therefore some residual compression will be present acting on the chamber. If the heat sink is to be heated to higher temperatures, the interference factor will be so chosen, within the above range, as to leave the chamber under a residual compression.

In FIG. 1 is shown a means for compressively holding the heat sink units in effective electrical and thermal contact with the SCRs. A pair of bolts 45, 46 is provided for holding the units 11 and 12 against the SCR 14. First bolt holes 47, 48 and 49, 50 are made in units 11 and 12, these holes opening through the unfinned strip portions 25 and 26. Then electrically insulating sleeves 51, 52, as of nylon, Teflon, etc., are placed in the holes of the upper unit 11 so that this unit will be electrically isolated from the lower unit 12. Leaf springs 53, 54 and 55, 56 are used to place the bolts under tension to permit expansion and contraction of the different materials and the SCRs during temperature changes. The whole is assembled as shown in FIG. 1, and nuts 57, 58 are used to apply a suitable amount of compression. The nuts are attached to the flat strip 59 to prevent rotation when tightened.

It will be understood that other compressive means may be employed, such as end clamps that engage strip portions 25 and 26 of units 11 and 12 and extend between the units along the end surfaces thereof.

In FIG. 1 there is also illustrated a manner of introducing electric current to the heat sink. An electrical buss 60 from a source of supply not shown is attached to the side 61 (FIG. 2) of unit 11 by bolts 62, 63 which enter the web 15 as shown. Another like buss 64 is similarly attached to unit 12. It will be understood that these rigid buss bars extend in the direction of the broken-off end. The current flow is as follows: from buss 60 through the heat sink unit 11, through the SCR 14, through unit 12, and out through buss 64. The SCR is thus in a series circuit, and the initial AC current is rectified.

Although the SCR 14 per se is not a part of the invention, a brief description of it may be of interest. Current from the chamber 32 enters the SCR at the end face 36 or working junction 65 (FIG. 2), also called the cathode. At 66 is a thin bellows sheet below which is an insulator 67. A control or gate terminal is at 68, this being the place which supports the silicon element or wafer and to which conducting wires, not shown, are attached to apply a small signal, and above and below are bellows components. At 69 is an insulation piece so shaped as to increase the electrical breakdown path. Bellows components are shown at 70, and the working junction or anode at 71. The cathode 65 has a surface 36 which makes contact with end face 34 of chamber 32, and the anode 71 has a surface 37 which engages end face 35 of chamber 33. The conducting wires attached to the gate 68 are brought out of the heat sink and usually are attached to a connector conveniently mounted on an outer surface thereof. It may be mentioned that the purpose of the insulation is twofold: to bring out of the SCR the control lead which can be isolated from the electrical potential between the SCR end faces, and to prevent the main current from by-passing the SCR. The purpose of the bellows is to permit the power package to be flexible so that pressure can be transmitted directly to the silicon wafer.

SCRs such as at 14 may be of varying size and may be used to pass varying currents, with the size increasing with the current. Thus, wafer diameters may range from 1 to 102 mm., or more, and across such small areas the current may range from 1 to 1000, 2000, 4000 or more amperes. As there is always a drop of 1 or 2 volts across the junction, the power loss, as heat, is high; thus, at 1000 amps. and a drop of 1 volt, the loss is 1000 watts; and at 4000 amps. and a drop of 2 volts, the loss is 8000 watts. These large heat losses must be dissipated, and in a continuous way, in order to prevent the SCR from reaching destructive temperatures. Preferably, the temperature of the SCR is kept below 140° C., and more preferably below 125° C. As is known, these devices are useful to modulate the power to electric motors, ovens, lamps, and other adjustable energy applications.

A preferred SCR device is a thyristor. It may also be a diode. Other heat-producing components that may be cooled are transistors, resistors, transformers, switches, reactors, capacitors, etc. It will be understood that these components have suitable surfaces engageable by one or more heat sink units and that they may be suitably modified, if necessary in order to install them in a heat sink, or the heat sink units may be suitably shaped to receive them.

The power packages described and illustrated herein are some times termed "power packs". Three heat sink units may be used to hold two SCR devices, and four units (one long and three short) may be used to hold three semiconductors. In short, any suitable number of semiconductors may be used with a long unit and as many short units as there are semiconductors. The invention is also applicable to "stud-mounted" SCRs, wherein only one end face of one SCR is engaged by a heat sink cooling surface, the other end face being connected to an ordinary electrical buss; the SCR is secured to the heat sink by conventional means, for example, a copper stud and nut, or a threaded copper stud, etc. The stud should not, of course, penetrate the vapor chamber and allow air or other non-condensible gas to enter.

Aluminum and high aluminum alloys are the preferred heat sink metals, and of these, extrudable aluminum alloys chambers, preferred, although aluminum casting alloys are quite suitable. Also useful are extrudable magnesium alloys, extrudable zinc alloys, die casting zinc alloys, and magnesium casting alloys. The preferred metals have a thermal conductivity of at least 90 or 100 BTU per hr. per sq. ft. per °F. governed ft. at or near the operating temperature of the heat sink; these include aluminum, copper, gold, silver, magnesium, bronze, etc. But for some purposes, metals having lower thermal conductivities may be useful, going down to at least 25 or 30 BTU per hr. per sq. ft. per ° F. per ft., and this is particularly true where the chamber metal is copper. Metals having thermal conductivities of 25 BTU etc. and up include cadmium, iron, steel, nickel, platinum, tantalum, tin, zinc, brass, etc. The heat sink metal should of course be fabricatable and should retain its strength during use. Generally, metals that are good thermal conductors also have low electrical resistivities; thus, a metal whose thermal conductivity is 100 BTU etc. usually has an electrical resistivity of about 3.8 microhm-cm.

Copper is preferred for the chamber, although other suitable metals include high copper aloys like bronze, brass, etc. In general, the chamber metal may be any suitable metal, although preferably it has a thermal conductivity that is at least twice that of the heat sink metal, and on this basis the chamber metal may be any metal having a thermal conductivity of at least 50 or 60 BTU etc.

The chamber may have a diameter that corresponds to the diameter of the component end face which it engages; usually the diameter ranges from ¼ to 2 inches or more. It should be understood that the larger the diameter of the chamber, the larger is the amount of heat which may be diffused by it.

In shrink fitting the chamber into the heat sink unit recess, it is desirable to heat the unit to temperatures at least as high as will be encountered in operation.

Generally, the end faces of the SCR or other component are smooth, and the chamber has a surface to correspond; but if the component has uneven or irregular faces, the chamber surface can be made to correspond. Provision can also be made for non-circular component faces.

As vaporizable agents useful in the vapor chambers there may be mentioned any organic or inorganic liquid of the kind usually employed in a heat pipe, including water, alcohols, ketones, esters, aldehydes, hydrocarbons, chlorinated hydrocarbons, organic acids, and the like. Some specific agents of interest are ammonia, hydrazine, methanol, acetic acid, and acetic anhydride. Selection of a particular agent is goverened mainly by the temperature level involved in cooling a particular component. For higher temperature levels one may use agents that are normally solid at room temperature, such as inorganic salts, alkali metals, alkaline earth metals, etc.

Figure 2:
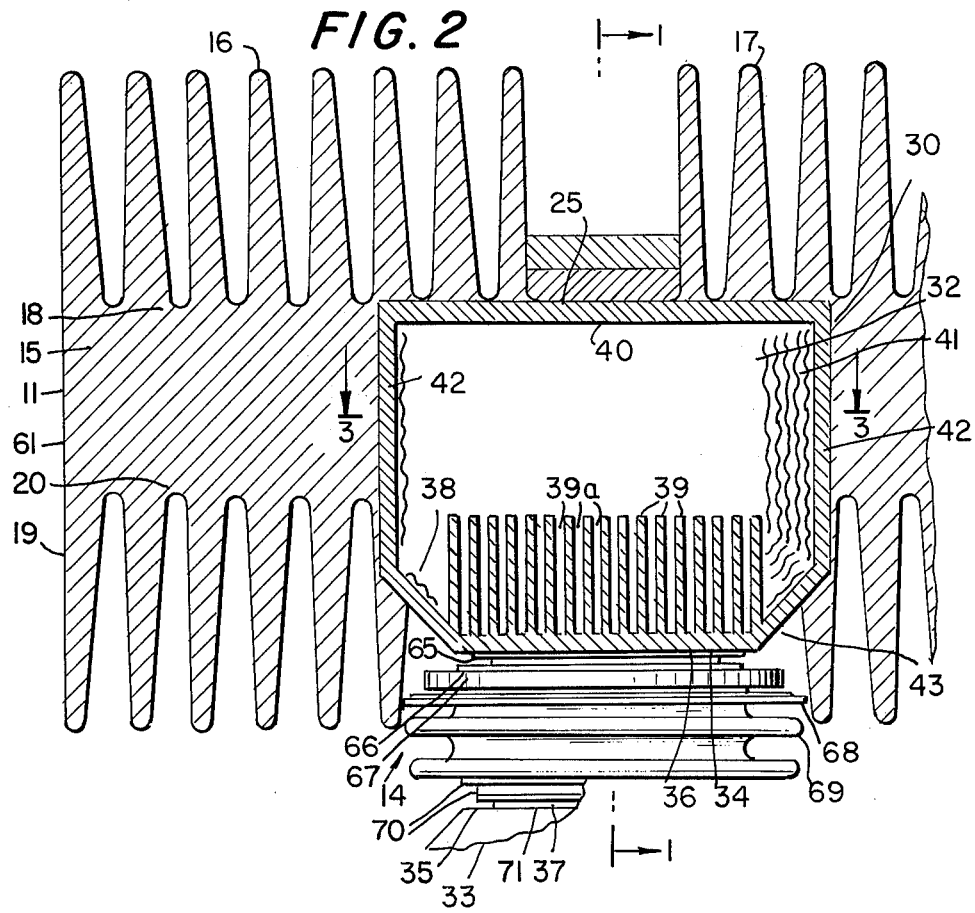
FIG. 2 is a partial cross-sectional view along line 2—2 of FIG. 1 showing the upper heat sink unit.

As may be seen, in FIGS. 1–3 a vapor chamber is embedded in each unit of the heat sink and is in thermal and electrical contact with surfaces of the heat-producing component. Vapors formed in each chamber by the absorption of heat by the vaporizable agent are cooled by vapor cooling means in the form of the chamber-surrounding webs of the units. The vapors are thus condensed, liberating heat of condensation, and means for dissipating such heat are available in the form of the fins on the units.

In FIG. 4 the heat-producing component, which suitably is the thyristor 75, is engaged by a pair of vapor chambers 76, 77. These are constructed substantially like the chambers 32, 33 except that they are not tapered but may be, they are somewhat flatter and larger, they have means in the form of an opening in a side wall through which vapors may be removed, and each has a pipe 78, 79 connected to said opening and extending therefrom and in communication with the chamber. Internally, the chambers 76, 77 are like chambers 32, 33, being provided with a vaporizable agent and a capillary structure. Pipe 78 may be considered to be a conventional heat pipe that includes the chamber 76, which functions as the evaporating section where vapors are formed, the section 80 which functions as the condensing section where the vapors are condensed and heat of condensation liberated, a capillary structure (not visible), and fins 81 for dissipating the liberated heat. In another view, the pipe 78 may be taken as the heat pipe with the portion 82 immediately adjacent the chamber 76 functioning as the evaporator section.

The heat pipe 78 represents vapor cooling means in thermal contact with the chamber 76 and serves to abstract heat from the vapors produced in the chamber. The vapors flow into the pipe 78 and are condensed in the section 80, heat of condensation being liberated which is dissipated to atmosphere by the fins 81.

Heat pipe 79 is like 78 and need not be described further.

At 83 and 84 are electrical leads for passing current across the component 75, and at 85, 86 is shown conventional electrical insulation for the heat pipes 78, 79.

Where the devices of FIGS. 1–3 and 4 may be used in any suitable location, that of FIG. 5 is intended for use where the component to be cooled is disposed within an enclosed structure, such as a cabinet, and where the liberated heat is brought outside the cabinet for dissipation to atmosphere. The device comprises a thyristor 88 that is to be cooled, upper and lower vapor chambers 89, 90 in thermal and electrical contact with the thyristor, means in the form of openings in a side wall of each chamber for removing vapors, heat pipes 91, 92 that are preferably unfinned but insulated at 93, 94 extending from the chamber openings and in communication with the chambers, and leads 95, 96, all as shown in FIG. 4. In addition, the heat pipes are seen as extending through openings in the cabinet wall 97 and terminating in vapors chambers 98, 99, respectively, that are embedded side by side in the web 100 of unit 101 of a heat sink generally indicated as 102. In this case, only one unit is required for the heat sink. Fins are shown at 103 and 104. In this arrangement, the vapor chambers 89, 90 cool the component in the manner described, vapors are formed in the chambers which flow through the heat pipes 91, 92 to the cooling chambers 98, 99 outside the cabinet where they are cooled by the thermal contact of the latter chambers with the web 100 of the heat sink, such web and the chambers 98, 99 thus functioning as vapor cooling means to condense tha vapors and liberate heat of condensation. The fins 103, 104 act to dissipate such heat to atmosphere. A motor-driven fan 105 helps to remove heat from the vicinity of the heat sink. It will thus be seen that the heat pipes 91, 92 serve to conduct the hot vapors isothermally from the interior of the cabinet to a location outside it.

If desired, the cooling chambers 98, 99 may be replaced by copper plugs, as described in said copending application, and in such case the reference numerals 98, 99 may also refer to the plugs. The copper plugs are excellent thermal conductors as well as electrical conductors and transfer heat to the web 100 of the heat sink; thus, the plug and the web act as vapor cooling means. Besides copper, the metal of the plug may be any metal having a thermal conductivity at least twice that of the heat sink metal and that is at least 50 or 60 BTU per hr. per sq. ft. per °F. per ft.

The chambers or plugs 98, 99 are surrounded by an electrically insulating, thermally conducting liner shown at 106 and 107. The liners are thus disposed between the vapor cooling means, as represented by the chambers or plugs, and the heat-dissipating means, as represented by the fins; and they insure that the heat sink 102 does not act to short circuit the thyristor 88. An advantage of the use of the liners is that they enable a manufacturer of electrical equipment to mount an electrically "dead" heat sink directly on or outside the wall 97 of the cabinet, whereas "live" or "hot" sinks cannot be so mounted. Another advantage is that several SCRs of varying potential may be associated with a single heat sink. In order that the heat sink 102 shall make proper use of the liners, it is to be understood that the outer faces 108 and 109 of the chambers or plugs 98, 99 shall not make electrical contact with the heat sink, and one way of bringing about such a result is to extend the liner material onto such end faces, as illustrated in FIG. 6, for the case of the chamber or plug 98.

In the modification of FIG. 6, the liner 106 encloses the cylindrical sides of the chamber or plug 98 and also most of the end face 108 except for an extension 98a which projects upwardly from the side 108 and which serves as a connector for an electrical lead. This modification, it will be understood, is applicable to the vapor chambers of FIGS. 1–3 by merely omitting the heat pipe 91, closing off the lower side 106a of the liner, and tapering the lower portion of the chamber 98 along the broken lines indicated at 98a.

If desired, heat sink 102 may comprise two units, and in such event the chambers or plugs 98, 99 would be held between the webs of the units. One of such webs would, of course, be apertured to receive the heat pipes 91, 92. The two units would be electrically insulated from each other. If also desired, three or four heat sink units may be employed.

Returning now to the liner 106, a preferred liner material is beryllium oxide, BeO, having a high density, i.e., a density greater than about 2.92 g/cc. This oxide is an excellent electrical insulator, having a resistivity of more than $10^{14}$ ohm-cm.; it has very good thermal conductivity, namely, 140 to 150 BTU per hr. per sq. ft. per °F. per ft., which is superior to that of a useful heat sink material, 6063 aluminum alloy, whose thermal conductivity is 121 BTU etc. The liner cap 106 may suitably be formed around the chamber or plug 98, and then the capped chamber or plug is shrink-fitted into a recess in the web 100 in the manner described above, it being understood that, at ambient conditions, the diameter of the capped chamber or plug is larger than the diameter of the recess. Beryllium oxide has adequate compressive strength, 260,000 kg./sq. cm., to serve as a liner. A preferred beryllium oxide material is one available commercially as "Alsimag 754", a product of American Lava Corp., which is a dense material containing 99.5% BeO. Another is "alsimag 794", which is like it but more dense.

Other materials suitable for use as liners include alumina, $Al_2O_3$, especially dense materials corresponding to American Lava Corp.'s "Alsimag 771" having 94% alumina, "Alsimag 614" having 96% alumina, "Alsimag 753" having 99.5% alumina, and "Alsimag 772" having 99.5% alumina. These materials have a compressive strength of well over 300,000 kg./sq. cm. Where the heat sink is of aluminum, a convenient way of placing an aluminum oxide liner between the chamber or plug and the recess in the heat sink unit is to subject the unit, or the walls of the recess thereof, to anodizing, thereby forming aluminum oxide in situ. The metal chamber or plug is then shrink fitted in the lined recess as described. Still other liner materials are steatite, $MgO.SiO_2$, corresponding to "Alsimag 460"; titania, $TiO_2$, corresponding to "Alsimag 192" and "Alsimag 193"; zircon, $ZrO_2.SiO_2$, corresponding to "Alsimag 475". Mica, preferably in thin sheets, may be suitable. It will be seen that the preferred liner material is a refractory metal oxide, particularly an oxide of a metal from Groups 2a and 4b of the Periodic System as published by Dyna-Slide Co., 1962. A preferred group of liner materials are oxides of beryllium, magnesium, and aluminum, these being oxides of light metals. In general, the liner should not crack, or be crushed, or adversely affect the shrink fit; it should be a good electrical insulator; it should have suitable thermal conductivity; and it should be compatible with the heat sink and chamber or plug materials.

Figure 7:
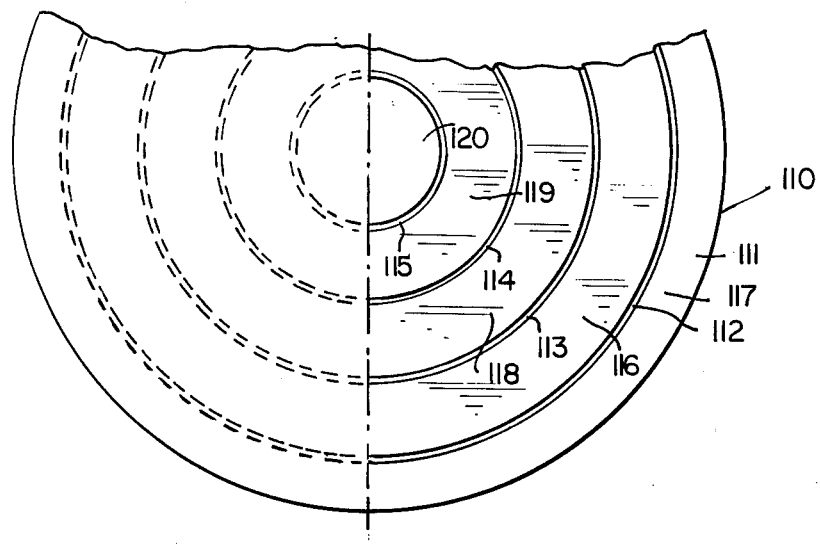
FIG. 7 is a partial end view of a modified vapor chamber.
Figure 8:
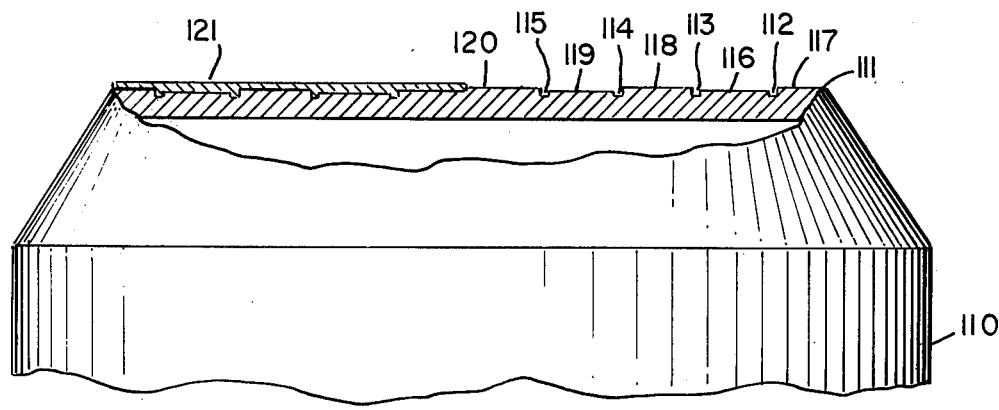
FIG. 8 is a partial side view, partly in section, of the vapor chamber of FIG. 7.

In FIGS. 7 and 8, a modified chamber 110 is shown which may be used in place of chambers 32, 33 of FIG. 1 or in place of any of the described chambers. The end face 111 which engages the SCR is provided with a plurality of annular grooves 112, 113, 114, and 115, each about 1/32 inch wide by 1/32 inch deep, although these distances may vary from 1/128 to 1/16 or ⅛ inch. Between grooves 112 and 113 an annulus 116 is formed having a level that is at least 1 or 2 thousandths of an inch, say 1 to 5 or 10 thousandths, below the level of the adjoining annuli 117, 118. Similarly, an annulus 119 is formed between grooves 114 and 115 having a level below that of the adjoining annuli 118 and 120. The annuli 117, 118, and 120 have the same level, which is that of the end face 111; while the annuli 116 and 119 also have the same level but, as described, lower than said end face 111. These annuli 116 and 119 may also be termed recessed annular bands. The end face 111 is coated with a low melting metal having a low electrical resistance, as illustrated by the coating 121 on the left hand side of the end face 111. The coating 121 forms an interface between the SCR end face and the chamber end face 111; although when the SCR and the chamber are compressed against such end face, the thickness of the coating may well decrease. The metal is applied in melted form to the end face 111 and allowed to solidify; and it is also applied to the mating face of the SCR, although such face is not grooved. Grooves may, however, be formed in it. When the power package is in use, the heat generated by the current ($I^2R$ interface losses) melts the metal coating and forms a liquefied bond or interface between the two end faces. The liquefied metal collects in the grooves and recessed annular bands and is retained there by virtue of capillary forces. In this connection, the annuli 116 and 119 should be at a level (below annuli 117, 118) capable of generating sufficient capillary forces to retain the liquefied metal in the interface. The low level range indicated above is suitable, but lower or higher levels may be used where necessary. Thus, the liquefied interface permits expansion without risk of gaps in the joint or interface. Some of the liquefied metal, as in the marginal portions of the interface, may have a tendency to leak out, but this does not affect the operation of the power package. The grooves, it may be noted, provide reservoirs of the liquefied metal. When the power package is not in use, i.e., is at room temperature, the metal coating solidifies, but it remains in the junction or interface between the chamber and the component. A preferred low melting metal is a bismuth-lead-tin-cadmium alloy, m.p. 158° F., which provides a low thermal resistance at the interface. In this connection, conventional thermal joint compounds are known, comprising grease-like materials, which exhibit a thermal resistance of about 0.02 °C./watt, but the metal interfaces contemplated by the invention show a thermal resistance only about ⅓ as high. For example, in a power package having a heat flow of 500 watts through one end face of the SCR, the conventional compound exhibits a thermal resistance of 0.02 °C./watt and a temperature drop of 10° C. through the interface, whereas with one of the metal interfaces considered herein, the thermal resistance would be 0.006 ° C./watt and the temperature drop only 3° C., or an improvement of 7° C.

Useful low melting point metals include bismuth-lead-tin-cadmium fusible eutectic alloys, particularly those containing 48 to 55% bismuth as these tend to exhibit little volume change when passing from the solid to the liquid state and vice versa, although alloys containing 40 to 48% and 56 to 60% bismuth may also be suitable. Generally, a preferred class of alloys are those having, besides 48 to 55% bismuth, about 18 to 40% lead, 2 to 15% tin, and 0 to 10% cadmium. Those alloys having 0% cadmium may contain 10 to 21% indium, although indium may also be present with the cadmium. Some eutectic alloys illustrative of the foregoing are:

| No. | Bismuth | Lead | Tin | Cadmium | Indium | M. Pt. |
|---|---|---|---|---|---|---|
| A | 44.7% | 22.6% | 8.3% | 5.3% | 19.1% | 117° F. |
| B | 49 | 18 | 12 | — | 21 | 136 |
| C | 50 | 26.7 | 13.3 | 10 | — | 158 |
| D | 51.6 | 40.2 | — | 8.2 | — | 197 |
| E | 52.5 | 32 | 15.5 | — | — | 203 |
| F | 54.0 | — | 26.0 | 20.0 | — | 217 |

Also useful are some non-eutectic fusible bismuth-lead-tin-cadmium alloys, i.e., those which melt over a range of temperature, provided the temperature range is within the temperature operating range of the SCR or other component to be cooled. These alloys may have 35–51% bismuth, 27–38% lead, 9–20% tin, and 3–10% cadmium. Some examples are:

| Q | 50.5 | 27.8 | 12.4 | 9.3 | 158–163 |
|---|------|------|------|-----|---------|
| R | 50   | 34.5 | 9.3  | 6.2 | 158–174 |
| S | 50.7 | 30.9 | 15.0 | 3.4 | 158–183 |
| T | 42.5 | 37.7 | 11.3 | 8.5 | 158–194 |
| U | 35.1 | 36.4 | 19.1 | 9.4 | 158–214 |
| V | 56.0 | 22.0 | 22.0 | —   | 203–219 |

It will be understood that for Nos. Q to V, the column headings of Nos. A to F apply. These same column headings apply to the examples below.

It is to be understood that the particularly desired alloy to be selected will depend on the temperature attained by the component, having regard to the result desired, namely, that at steady state operation of the component or power package, the alloy interface shall be in a liquefied state. The foregoing alloys are useful where the component temperature, at steady state operation, is in the range of about 110° to 225° F. For components having a higher operating temperature, eutectic alloys may be chosen having a higher bismuth content, say up to 60 or 70%; a higher lead content, when present, say up to 45%; higher tin, when present, of up to 60%; and higher cadmium, when present, going up to about 40%. Some illustrative examples of higher melting eutectic alloys include:

| No. | Bismuth | Lead  | Tin  | Cadmium | M. Pt.  |
|-----|---------|-------|------|---------|---------|
| G   | 55.5%   | 44.5% | —    | —       | 255° F. |
| H   | 58.0    | —     | 42.0 | —       | 281     |
| J   | 60.0    | —     | —    | 40.0    | 291     |

Non-eutectic alloys useful at higher temperatures include

| W | 67.0 | 16.0 | 17.0 | — | 203–300 |
|---|------|------|------|---|---------|
| X | 33.3 | 33.3 | 33.3 | — | 203–289 |
| Z | 40.0 | —    | 60.0 | — | 281–338 |

Other useful low melting alloys are high tin alloys such as soft solder, type metal, fusible metal, pewter, bronze, bell metal, Babbitt metal, White metal, etc. It may be noted that the metal should be able to melt at a temperature low enough to prevent the SCR or other component from overheating.

It will be understood that any of the chambers described herein may be provided with the grooves and bands of FIGS. 7 and 8, and that such grooves and bands are applicable to the plugs as well as the chambers. Similarly, the liners of FIGS. 5 and 6 are applicable to any of the described chambers and plugs.

The invention may be illustrated by the following example.

EXAMPLE

For purposes of this experiment, a closed square-shaped vapor chamber was constructed measuring 3 inches × 2 15/16 inches × 1 1/16 inches and comprising a substantially square-shaped body piece and a cap therefor. The body piece comprised a 3 inches × 2 15/16 inches sheet having 16 fins extending upwardly from one side, each measuring 2 inches × ⅝ inch × 1/16 inch and spaced 1/16 inch apart, with each fin having V-shaped vertically extending grooves cut into both sides and measuring 1/64 inch wide and 1/64 inch deep. The grooves were 1/32 inch apart. Surrounding the group of fins was a half inch wide unfinned marginal portion. The cap was 3 inch × 2 15/16 inches and had four depending centrally apertured side walls each measuring 3 inches × 15/16 inch. When the cap was placed over the body piece, it enclosed the fins, forming a chamber of the size described. The sides of the cap were soldered to the sheet of the body piece.

The apertures in the cap side walls were of 9/16 inch diameter, and in each there was securely fitted by soldering a pipe or tube of corresponding diameter and measuring about 9 inches in length. The inner end of each pipe was open to the chamber interior while the outer end was sealed. Each pipe was wrapped with a copper coil for passage of cooling water, the coil being positioned intermediate the vapor chamber and the outer end of the pipe and being soldered to the pipe to provide good heat transfer. Instead of the coil, external cooling fins could have been used to dissipate heat, using a fan to blow air over the fins; however, for purposes of the experiment, water cooling was thought to be more convenient as the device could be operated at various temperatures by varying the velocity of the water that passed through the coil.

Before sealing the chamber, it was evacuated of all air and non-condensible gases, and there was added to it a vaporizable agent comprising water. The V-grooved fins served to increase the heat transfer area over that which would be normally available. In addition, there was added as a capillary material a layer of copper screen around the base of the grooved fins and around the inside of the enclosed chamber. The pipes or tubes were provided with a capillary material comprising a slab or narrow sheet type wick of copper screen disposed centrally across the inside diameter thereof.

For convenience, heat was supplied to the vapor chamber by means of an electrically heated aluminum block instead of a semiconductor or other component. Use of the heated block enabled the heat flow to be measured not only accurately but conveniently. The block was 4 inches long and had a diameter of 3 inches. One end portion of the block was tapered to produce an end face of 2 inches diameter, and on this face the vapor chamber was supported. The block was heated by 3 Cal-rod heaters inserted in recesses extending upwardly from the bottom of the block. External insulation covered the sides and bottom to avoid heat losses and to insure that heat passed through the upper end face and into the bottom side of the vapor chamber.

The experiment was conducted by heating the block electrically, both the voltage and the current being recorded to calculate the applied power in watts. By means of thermocouples, the temperature was recorded at the following locations during steady state operation:

TC 1 — At the center of the external surface of the bottom wall of the vapor chamber.

TC 2 — In the tapered surface of the block, just below its upper end face. This temperature represented that of the heat source side of the interface, while TC 1 gave the temperature of the vapor chamber side of the interface.

TC 4 — On the heat pipe on the side of the coil remote from the vapor chamber. This indicated the temperature of the vaporized agent.

TC 6 — Like TC 4 but on a second heat pipe.
TC 8 — Like TC 4 but on a third heat pipe.
TC 10 — Like TC 4 but on a fourth heat pipe.

The temperature data, in °F., of 5 runs may be tabulated as follows:

Table 1

| Run No. | A | B | C | D | E |
|---|---|---|---|---|---|
| Voltage, volts | 90 | 90 | 113 | 70 | 70 |
| Current, amps. | 4.9 | 4.8 | 6 | 3.7 | 3.7 |
| Power, watts | 441 | 432 | 678 | 259 | 259 |
| Temperature, ° F. | | | | | |
| TC 1 | 201 | 182 | 211 | 193 | 123 |
| TC 2 | 224 | 203 | 247 | 207 | 140 |
| TC 4 | 185 | 167 | 188 | 182 | 112 |
| TC 6 | 184 | 165 | 188 | 182 | 112 |
| TC 8 | 186 | 167 | 185 | 182 | 111 |
| TC 10 | 179 | 161 | 181 | 176 | 110 |

From these data, the thermal resistance, TR, of the vapor chamber was calculated, using the equation $$TR \; (°\text{F./watt}) = \frac{\Delta T}{\text{Power}} = \frac{TC\;1 - \text{Vapor Temperature}}{\text{Power}} \quad (1)$$

TC 1 was, of course, the temperature measured by the first thermocouple, noted above. The vapor temperature was taken to be the highest reading on the four external thermocouples, i.e., TC 4, TC 6, TC 8, and TC 10. Power in watts was determined by multiplying the voltage in volts by the current in amperes. On this basis, the following results may be tabulated:

Table 2

| Run No. | A | B | C | D | E |
|---|---|---|---|---|---|
| ΔT (TC 1 minus vapor temp.) ° F. | 15 | 15 | 23 | 11 | 11 |
| ΔT ° C. (1° C. = 1.8 ° F.) | 8.35 | 8.35 | 12.8 | 6.1 | 6.1 |
| TR (° C./watt) | 0.0189 | 0.0193 | 0.0188 | 0.0235 | 0.0235 |

Referring to Run A and the temperature difference of 15° F., this may be contrasted with a temperature difference of 45° F. obtained with a conventional unfinned heat pipe without capillary material, from which it is apparent that the result with the latter is 3 times higher. Or stating it in terms of thermal resistance, TR, the conventional unfinned wickless heat pipe gives an average TR of about 0.06° C./watt, which is about 3 times higher than the range of 0.0188 to 0.0235° C/watt obtained in Runs A to E. A closed square-shaped vapor chamber like that described in the first paragraph of this example, but having no fins and no capillary material, would give substantially the same results as a conventional unfinned wickless heat pipe in respect of thermal resistance and temperature difference.

It may be noted that in Table 1, the temperatures in Run E were lower than in Run D, even though the power was the same, because the amount of water passed through the cooling coils was higher in Run E than Run D.

It will be understood that the invention is capable of obvious variations without departing from its scope.

In the light of the foregoing description, the following is claimed.

We claim:

1. Apparatus for cooling a heat-producing power semiconductor comprising a pair of enclosed vapor chambers each having a depth of approximately the same order of magnitude as the depth of the semiconductor, each chamber having a wall which is in tight mating contact with one face of a pair of opposed faces of said semiconductor, said tight mating contact being provied by clamping means holding the vapor chambers to the semiconductor, said chambers and semiconductor being enclosed in a cabinet, a layer of low melting point metal between each said wall and face and forming an interface therebetween which is effective to pass electric current and heat thereacross, said metal being solid at ambient conditions but having a metal point sufficiently low that the passage of heat through the interface is enough to melt the metal and to form a liquified metal interface, a vaporizable agent in each chamber for absorbing heat passing through the interface from the semiconductor and thereby becoming vaporized, means in each chamber comprising an opening in a side thereof for removing resulting vapors therefrom, a plurality of spaced fins extending from the inner surface of said wall for a substantial distance at least part of the way across said chamber, said fins being elongated and closely spaced and having capillary means in contact therewith which impart to the fins a wicking action, said capillary means being saturable by said agent in liquefied state, and the diameter of each chamber being greater than its depth to insure effective wicking action, an electrically and thermally conductive tube connected to said opening of each chamber and extending out of said cabinet for transferring vapors away from said chambers, said tube being distinct from said chamber, an electric lead connected to each tube adjacent the chamber to help establish an electric circuit incorporating said chambers and semiconductors, said tubes being otherwise electrically and thermally insulated, and capillary means in each tube, vapor cooling means beyond said cabinet connected to each tube for abstracting heat from said vapors, thereby serving to condense the vapors with the concomitant production of heat of condensation, a finned heat sink in heat exchange relation with each said vapor cooling means for dissipating said abstracted heat and said heat of condensation, a liner of an electrically insulating, thermally conducting material between each said vapor cooling means and said heat sink whereby the latter is electrically non-conducting but thermally conducting;

and said condensed vapors being transferrable by the capillary means in said tubes from said vapor cooling means back to said vapor chambers and being transferrable by the capillary means in the chambers to an area adjacent each interface where they may be re-vaporized and again made effective to absorb heat from said interface.

2. Apparatus for cooling a heat-producing electrical or electronic component comprising a pair of enclosed vapor chambers each having a depth of approximately the same order of magnitude as the depth of the component, each chamber having a wall which is in tight mating contact with one face of a pair of opposed faces of a component, said tight mating contact being provided by clamping means holding the chambers to the component, said chambers and component being enclosed in a cabinet, each said mating contact forming an interface which is effective to pass electric current and heat thereacross, a vaporizable agent in each chamber for absorbing heat from the component across the interface and thereby becoming vaporized, means in each chamber comprising an opening in a side thereof for removing vapors therefrom, a plurality of closely spaced elongated fins extending from the inner surface of said wall for a substantial distance at least part of the way across said chamber, said fins having capillary means in contact therewith which impart to the fins a wicking action, and the diameter of each chamber being greater than its depth to insure effective wicking action, an electrically and thermally conductive conduit connected to said opening of each chamber and extending out of said cabinet for transferring vapors away from said chambers, said conduit being distinct from said chamber, an electric lead connected to each conduit to help establish an electric circuit incorporating said chambers and component, said conduits being otherwise electrically and thermally insulated, and capillary means in each conduit, vapor cooling means beyond said cabinet connected to each conduit for abstracting heat from said vapors, thereby serving to condense the vapors with the concomitant production of heat of condensation, means for dissipating heat from said vapor cooling means, and said condensed vapors being transferrable by the capillary means in said conduits from said vapor cooling means back to said vapor chambers and being transferrable by the capillary means in said chambers to an area adjacent each interface where they may be revaporized and again made effective to absorb heat from said interface.

3. Apparatus of claim 2 wherein said vapor cooling means is a copper plug and said heat-dissipating means is a finned heat sink, and wherein said plug is embedded in the heat sink and in a state of compression therein effective to transfer heat thereto.

4. Apparatus of claim 2 wherein said vapor cooling means is a second vapor chamber and said heat-dissipating means is a finned heat sink, and wherein said second vapor chamber is embedded in the heat sink and in a state of compression therein effective to transfer heat thereto.

5. Apparatus of claim 2 wherein a liner of an electrically insulating, thermally conducting material is interposed between said vapor cooling means and said heat-dissipating means, thereby to make the latter electrically non-conducting but thermally conducting.

6. Apparatus of claim 2 wherein said interface has a layer of low melting point metal between each said wall and face which is solid at ambient conditions but which melts with the passage of heat therethrough, thereby forming a liquefied metal interface, and wherein each said wall has a plurality of annular grooves and annular recessed bands for retaining said liquefied metal in said interface.

7. A heat sink for cooling a heat-producing electrical or electronic component comprising a pair of enclosed vapor chambers having a depth of approximately the same order of magnitude as the depth of the component, each chamber having an electrically and thermally conductive wall which is in tight mating contact with a face of said component, clamping means for holding the chambers and component in said tight mating contact, said mating contact forming an interface which is effective to pass electric current and heat thereacross in a direction substantially normal to said interface, a plurality of closely spaced elongated fins extending from the inner surface of said wall for a substantial distance at least part of the way across said chamber, said fins having capillary means in contact therewith which impart to the fins a capillary or wicking action, a second capillary means in the chamber occupying the chamber volume not occupied by the fins, a vaporizable agent in the chamber occupying the space between fins and effective to absorb heat from the component across the interface, thereby becoming vaporized, the diameter of said chamber being greater than its depth to insure effective wicking action, vapor cooling means in thermal contact with each chamber and disposed externally thereof for abstracting heat from said vapors, thereby serving to condense the vapors with the concomitant production of heat of condensation, said vapor cooling means comprising a web in said heat sink having a recess in which said vapor chamber is tightly disposed in a state of compression, said chamber having electrically conductive walls for passing current from the interface to said web, an electrical lead attached to each said web for introducing current to, and removing current from, said heat sink, and means for dissipating heat from said vapor cooling means comprising fins on upper and lower sides of said web which extend in a direction substantially normal to end faces of said web.

8. Heat sink of claim 7 wherein the capillary means in contact with the fins comprises a plurality of grooves in the surfaces of said fins.

9. Heat sink of claim 7 wherein the capillary means in contact with the fins comprises a wicking material in contact with said fins.

10. Apparatus for cooling a heat-producing electrical or electronic component comprising an enclosed vapor chamber of a depth of approximately the same order of magnitude as the depth of the component, said chamber having an electrically and thermally conductive wall which is in tight mating contact with a face of said component, said contact being provided by clamping means holding the chamber to the component, said mating contact forming an interface which is effective to pass electric current and heat thereacross in a direction substantially normal to said interface, a plurality of closely spaced elongated fins extending from the inner surface of said wall for a substantial distance at least part of the way across said chamber, said fins having capillary means thereon which impart to the fins a wicking action, a second capillary means in the chamber occupying the chamber volume not occupied by said fins, a vaporizable agent in the chamber for absorbing heat from the component across the interface and thereby becoming vaporized, the depth of said chamber being small enough to insure an effective wicking action and being less than the diameter of the chamber, vapor cooling means in thermal and electrical contact with the chamber for abstracting heat from said vapors, thereby serving to condense the vapors with the concomitant production of heat of condensation, said chamber having electrically conductive walls for passing current from said interface to said vapor cooling means, an electrical lead attached to said vapor cooling means to provide for current flow through said interface and chamber, and means disposed outwardly of and spaced from the chamber for dissipating heat from said vapor cooling means.

11. Apparatus of claim 10 wherein said vapor cooling means is the solid web of a heat sink unit and said heat-dissipating means comprises the finned portion of said heat sink unit, said chamber being embedded in the heat sink unit and having a shrink fit therein effective to transfer heat thereto.

12. Apparatus of claim 10 wherein said vapor cooling means comprises the condensing section of a heat pipe connected to a side wall of said chamber and said heat-dissipating means comprises fins mounted on said section.

* * * * *

UNITED STATES PATENT OFFICE
CERTIFICATE OF CORRECTION

Patent No. 4,012,770   Dated March 15, 1977

Inventor(s) Milton F. Pravada et al.

It is certified that error appears in the above-identified patent and that said Letters Patent are hereby corrected as shown below:

Column 6, line 19, "chambers" should read -- are --.
Column 6, line 24, "governed" should read -- per --.
Column 6, line 41, "aloys" should read -- alloys --.

Signed and Sealed this second Day of August 1977

[SEAL]

Attest:

RUTH C. MASON
Attesting Officer

C. MARSHALL DANN
Commissioner of Patents and Trademarks